(12) United States Patent
Gebhardt et al.

(10) Patent No.: US 6,545,473 B1
(45) Date of Patent: Apr. 8, 2003

(54) SWITCHABLE GRADIENT COIL SYSTEM FORMED BY SADDLE COILS

(75) Inventors: Matthias Gebhardt, Erlangen (DE); Heinz Hentzelt, Erlangen (DE); Eva Eberlein, Baiersdorf (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/550,113

(22) Filed: Apr. 14, 2000

(30) Foreign Application Priority Data

Apr. 15, 1999 (DE) .......................... 199 17 058

(51) Int. Cl.[7] .................................................. G01J 3/00
(52) U.S. Cl. ........................................ 324/318; 324/322
(58) Field of Search .................... 334/318; 324/318, 324/307, 309, 320, 322

(56) References Cited

U.S. PATENT DOCUMENTS

| | | | |
|---|---|---|---|
| 5,012,192 A | | 4/1991 | Siebold |
| 5,198,769 A | | 3/1993 | Frese et al. |
| 5,278,504 A | * | 1/1994 | Patrick et al. ............... 324/318 |
| 5,311,135 A | * | 5/1994 | Vavrek et al. ............... 324/318 |
| 5,675,255 A | | 10/1997 | Sellers et al. |
| 5,736,858 A | | 4/1998 | Katznelson et al. |
| 6,157,280 A | * | 12/2000 | Arz et al. .................... 324/320 |
| 6,208,140 B1 | * | 3/2001 | Gebhardt et al. ........... 324/309 |
| 6,297,635 B1 | * | 10/2001 | Arz et al. .................... 324/318 |

OTHER PUBLICATIONS

"Physiological Effect of Fast Oscillating Magnetic Field Gradients," Budinger et al., Journal of Computer Assisted Tomography, 15 (6), Nov./Dec. 1991, pp. 909–914.

* cited by examiner

Primary Examiner—Edward Lefkowitz
Assistant Examiner—Dixomara Vargas
(74) Attorney, Agent, or Firm—Schiff Hardin & Waite

(57) ABSTRACT

A switchable gradient coil system is composed of saddle coils that can be operated respectively as primary coils or auxiliary coils. The auxiliary coils for one gradient axis, which exhibit a reduced subtended angle compared to the primary coils, are arranged in the gaps between coils that are arranged diametrically opposite each other in a radial plane for the other gradient axis.

38 Claims, 2 Drawing Sheets

SWITCHABLE GRADIENT COIL SYSTEM FORMED BY SADDLE COILS

BACKGROUND OF THE INVENTION

1. Field of the Invention

The present invention relates to a switchable magnetic gradient coil system that is formed on the basis of saddle coils that are operated as primary coils or auxiliary coils for different gradient axes.

2. Description of the Prior Art

The required efficiency of a magnetic gradient coil essentially depends on the type of MR-imaging being conducted. Conventional MR-imaging normally requires a good linearity volume (~5% in the linearity volume of 40–50 cm) given moderate gradient intensities (10–20 mT/m) and switching times (~1 ms). High gradients (20–40 mT/m) are extremely rapidly switched (100–500 µm) the fast MR-imaging. Side effects in the form of peripheral muscle stimulations can occur as described, for example, by Budinger et al., "Physiological Effects of Fast Oscillating Magnetic Field Gradients," J. Comp. Assisted Tomog., Vol. 15, 1991, pp. 909–915. The linearity volume of the gradient coils is generally reduced in order to avoid these effects, since this produces a reduction of the maximum field boost and therefore also a reduction of the stimulation risk (apart from other aspects, the maximum field boost determines the stimulation risk). Therefore, the linearity volume can be reduced from typically 40–50 cm to 20 cm DSV given fast gradient coils. Normally, a coil with such properties is not appropriate for conventional whole body applications but is appropriate for fast MR-imaging techniques, such as EPI, RARE, HASTE, GRASE etc. Speed is the significant advantage here.

Another reason for different field qualities is that the linearity volume normally becomes reduced with increased distance from the center when a gradient coil is designed for a specific volume. The human body, however, does not necessarily conform to this shape. For example, the shoulders are situated in this area. Given pickups of the spine, it is often, expedient to image the entire spine without rearrangement. Depending on the center positioning, the cervical and/or lumbar vertebras may also lie in the area of the higher non-linearities. Image distortions cannot be avoided as a result. In head gradient coils, the homogeneity volume is smaller due to the smaller diameter of the coil. This allows parts of the brain to be imaged but does not allow imaging of the cervical spine. Therefore, it can be desirable for the radiologist to change from a central FOV to a displaced or shifted FOV. Heretofore, this has not been possible. There are only embodiments of one type or the other type.

Due to the above reasons, the customer needs to decide whether a field quality A, B or C is needed. It would be desirable, however, to have a number of coil properties (field qualities) combined in one coil and to activate these depending on the application. A basic problem in achieving this is the accommodation of the multiple coils in the coil body without significantly increasing the volume (thereby causing the coils to be more expensive) and without comprising the sub-coil properties that are partially competing.

German OS 195 40 746, describes a modular gradient system in which a conventional gradient coil system and a rapid gradient coil system are combined in a coil body. In this known system the conventional gradient system exhibits a large linearity volume but can be switched only slowly and also allows only average gradient amplitudes. By contrast, the rapid gradient system shows a smaller linearity volume but allows extremely high gradient amplitudes to be switched more rapidly.

For appropriate background, the general state of the art of gradient coil technology will be summarized.

Shielded and unshielded gradient coils are utilized in the MR-imaging. Generally, these gradient coils are sealed or cast in the vacuum, so that a higher voltage load is achieved, Therefore, the gradient coil is formed as a compact tube with typically three electrical terminal pairs, given cylindrical MR systems, or is formed as a plate pair given C-shaped MR systems, (such as the Siemens MAGNETOM OPEN) with typically six electrical terminal pairs. The subject matter disclosed herein is only concerned with cylindrical systems, however, the discussion is generally valid for non-cylindrical systems as well.

Generally, non-shielded gradient coils are composed of a number of sub-coils that are connected in the coil body. For example, an unshielded transverse coil (X, Y) is composed of four coils referred to as saddle coils (FIG. 1), which are connected to a gradient axis in the coil body.

In principle, actively shielded gradient coils are composed of primary layers and secondary layers. Primary coils and secondary coils are matched to one another such that the magnetic flow is minimized on a selected cylinder surface (normally the position of the cryostat tube of the magnet or other conductive structures) outside of the coil tube in order to avoid eddy currents. The sub-coils also are connected within the coil body, so that connection to the exterior world is normally only via the six terminal contacts described above.

Coils referred to as split gradient coils represent an exception; symmetrical sub-coils are separately connected to the amplifier. Such a coil is normally comprised of two symmetrical parts. The terminals are doubled as a result. The advantage of such coils is the faster switching times (due the halved inductivity), however, twice as many gradient amplifiers are required making the system more expensive.

Segment coils are known and represent a further realization of gradient coil designs. Examples of such segment coils are described in Genan OS 40 29 477 (corresponding to U.S. Pat. No. 5,198,769) and German PS 195 27 020 (corresponding to U.S. Pat. No. 5,675,255). No return conductors are disposed in the same cylinder surface as the active conductors in this type of coil design. The return conductors are situated at a different radius. Ideally, the segments exhibit an aperture or coverage angle of 120° in order to achieve the best field quality. At least four segments are also connected to one unit within the coil body in order to generate a satisfactory gradient field. For adapting the linearity volume to the clinical requirements, a number of these segments are distributed along the Z-axis and are connected to one another, so that the coil body as such only has the usual three terminal pairs.

Coil designs referred to as 3D gradient coil designs are a mixture of the conventionally shielded coils and the segment coil. Given this design, some or all return conductors of the transverse coils are foregone, which would be situated at the ends of the gradient coil body. Instead of the return conductors, direct connections between the primary layer and the secondary layer are present.

All these known switchable gradient coils have the disadvantage of either requiring an extremely complicated drive for switching the different sub-windings or, due to the possibility of being able to only accommodate the hitherto utilized saddle coils as pairs in a radial layer, a number of radial layers is required for purposes of accommodating the sub-coils, resulting in the volume of the gradient coil being significantly increased and the field properties being impaired in the imaging region.

SUMMARY OF THE INVENTION

An object of the present invention is to provide a switchable gradient coil system formed by saddle coils such that a gradient coil system having a small volume can be realized with a construction that is simple in terms of switching, and which can be optionally designed for different performance features.

The object is inventively achieved in a gradient coil system composed of saddle coils that are operated as primary coils or auxiliary coils respectively for different gradient axes, and wherein the auxiliary coils, which exhibit a correspondingly reduced subtended angle compared to the coils operated as primary coils, for one gradient axis are arranged in the gaps between coils that are diametrically offset in a radial plane for the other gradient axis, and wherein the primary coils and/or auxiliary coils of each layer can be divided into a number of sub-coils that can be connected differently with one another.

In a first embodiment of the invention the auxiliary coils for both gradient axes are arranged as pairs that are offset to one another by 90° in a separate radial planes, with each auxiliary coil subtending having an angle $\alpha \leq 90°$. Therefore, two radial layers are no longer necessary for the auxiliary coils, since they are accommodated together in one radial layer.

In a second embodiment of the invention the auxiliary coils for each gradient axis are arranged in the same radial layer between the primary coils for the other gradient axis, these primary coils each exhibiting a subtended angle $\alpha \geq 90°$, preferably 120°.

As a result, additional radial layers, which only increase the spatial construction of the gradient coil system, are not required at all in this embodiment for accommodating the auxiliary coils. The space present between the primary coils, which has hitherto not been used, is utilized in the inventive system to accommodate auxiliary coils for the other gradient axis. The fact that the additional coils—due to the preferred fashioning of the primary coils with a subtended angle of 120°—can then only exhibit overlap angles of maximal 60°, does not constitute a limiting factor, since they need not be solely responsible for producing the desired gradient coil for qualities.

This inventive embodiment results in a total structure which occupies a small space and also enables an extremely simple connecting of the different primary coils and auxiliary coils among each other, even when the inventive switchable gradient coil is designed in a shielded fashion and coil pairs for the same gradient axis being in different radial layers. Given this shielded embodiment, auxiliary coils are arranged in at least one of the layers for another gradient coil axis.

The coil pairs of each layer, which are respectively operated as primary coils for one gradient axis and as primary coils or auxiliary coils for the other gradient axis, are connectable to the auxiliary coils or primary coils arranged in other layers in different ways depending on the desired performance features. The primary coils and auxiliary coils can be statically connected with one another prior to executing the imaging sequence and can be dynamically connected during the imaging sequence, thereby allowing the field properties and performance features of the switchable gradient coil to be changed during a sequence. Suitable connection arrangements for this purpose are described in U.S. Pat. Nos. 6,205,140 and 6,297,635. The teachings of each of these patents are incorporated herein by reference.

DESCRIPTION OF THE PREFERRED EMBODIMENTS

Conventionally, the construction of a non-shielded gradient coil has been designed such that (for example) two saddle coils 1a and 1b for one gradient axis (X-axis) are arranged in a first radial layer and respectively subtend (cover) an angle of 120°, whereas saddle coils 2a and 2b, which are offset thereto by 90° and which also subtend an angle of 120°, are arranged for the second gradient axis (Y-axis). In order to be able to undertake switching of the gradient coil according to the desired performance features, such as linearity, linearity volume, shielding, inductivity, noise (participation factors), stimulation sensitivity, maximal gradient intensity and maximal slew rate, a construction is inventively provided as it is basically shown in FIG. 1. In addition to the saddle coils 1a and 1b, which exhibit the conventional subtended angle of 120° or somewhat less, two further saddle coils 2a' and 2b' are arranged in the inner radial layer with the saddle coils 1a and 1b for the X-gradient axis, which saddle coils 2a' and 2b' function as auxiliary coils for the saddle coils 2a and 2b arranged in the second layer for the Y-gradient axis. Additional, saddle coils. 1a' and 1b', which, as auxiliary coils, can be optionally connected with the saddle coils 1a and 1b for the X-gradient axis, are also provided in the radial outer layer with the saddle coils 2a and 2b for the Y-axis that also subtend an angle of 120°.

Thus, the auxiliary saddle coils 1a', 1b', 2a', 2b' in and of themselves need not exhibit qualities as a gradient coil; it is sufficient when they, in combination with the respective primary saddle coils, can change properties for the corresponding gradient coil in a desired manner according to pre-selectable performance features.

Figure 1:
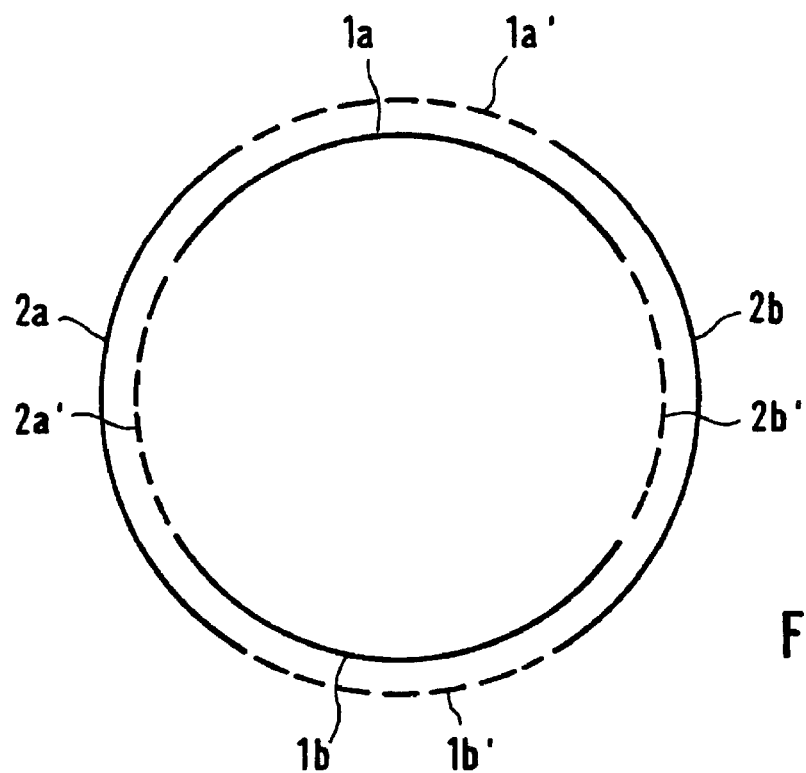
FIG. 1 is a schematic section though an inventive switchable gradient coil system having auxiliary coils arranged in each radial layer of the primary coils.
Figure 2:
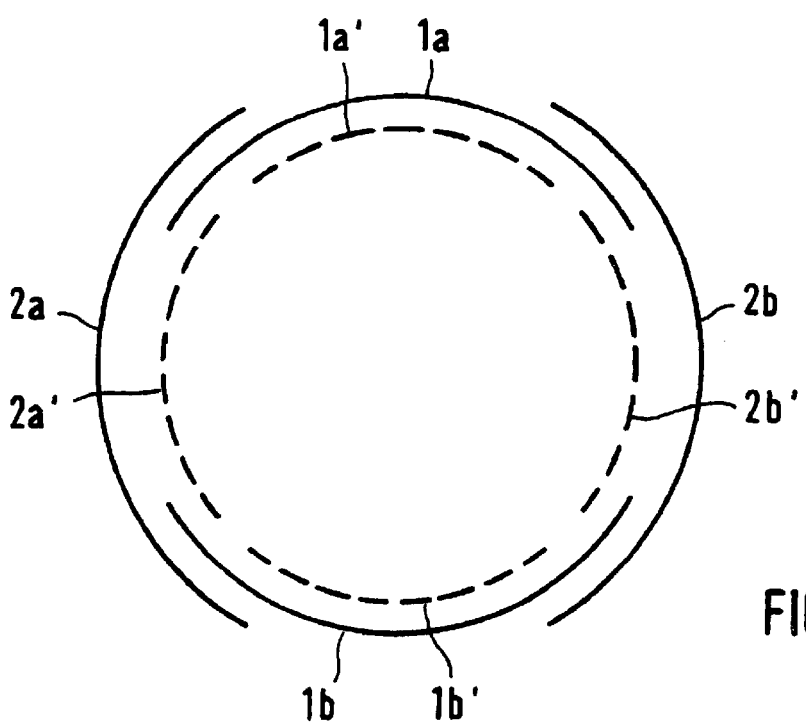
FIG. 2 is a schematic section through an inventive non-shielded gradient coil system for two gradient axes (X-axis, Y-axis) with auxiliary coils In a third radial layer.

In the arrangement shown in FIG. 2, the auxiliary coils 1a', 1b' and 2a', 2b' are not arranged in the gaps of the primary coils for the respective other gradient axes as shown in FIG. 1, but instead they are arranged in an additional third plane, however, all four coils 1a', 1b', 2a' and 2b', each subtending an angle of less than 90°, can be accommodated in a common plane. This still results in a better economy of space than the conventional arrangements of additional coils, even though the optimal economy of space of the type according to FIG. 1 does not occur. In the arrangement according to FIG. 1, the additional coils are fashioned with a smaller subtended angle <60°, since the primary coils 1a, 1b and 2a, 2b exhibit the larger subtended angle of 120° that assures a better linearity, so that only a smaller subtended angle is available to the additional coils in the respective gaps of the primary coils. It possible, however, in special cases to fashion the primary coil with a subtended angle of only $\alpha \leq 90°$, so that the auxiliary coils arranged in the same radial plane can subtend an angle of approximately 90°. The linearity, however, is less as a result, so that the embodiment according to the FIGS. 1 and 2 generally remains preferred.

The advantage of the inventive arrangement is the better economy of space. The spatial conditions in gradient coils can be extremely confined in the radial dimension, in particular, since line connections, devices for cooling or temperature monitoring have to be present in addition to the actual coil windings. Devices that go beyond the pure function of generating the gradient field, such as devices for correcting the magnetic basic field, can be additionally integrated.

A further advantage of the inventive fashioning of a switchable gradient coil is the better capability for cooling. Since both coils are constructed on a common radius, they can be cooled with the same efficiency by means of a cooling device attached at one side, for example, attached radially, at the interior.

Figure 3:
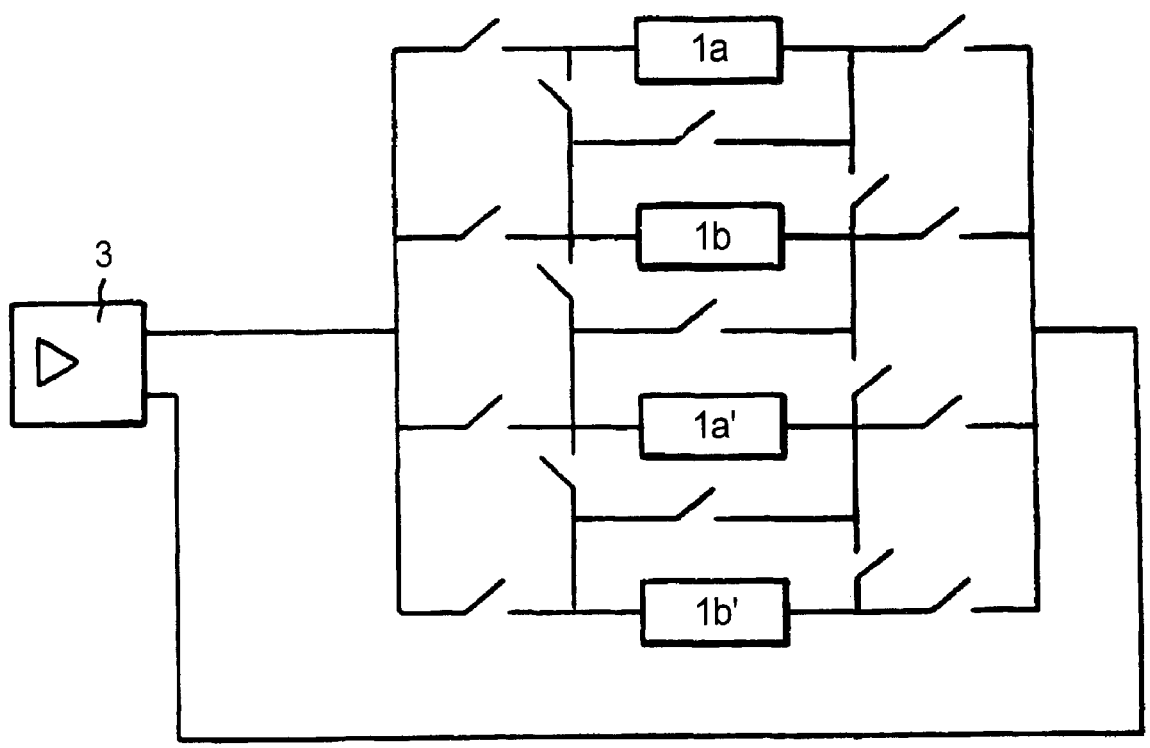
FIG. 3 illustrates a switching arrangement for one set of saddle coils and the associated auxiliary saddle coils.

FIG. 3 illustrates a switching arrangement for interconnecting the saddle coils 1a and 1b with their associated auxiliary saddle coils 1a' and 1b', all of which are supplied by a gradient amplifier 3. For static switching, a selected combination of switch closings and switch openings is set prior to executing an imaging sequence. For dynamic switching, the openings and closings of the switches can be selectively altered during an imaging sequence.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic gradient coil system comprising:
   a first plurality of saddle coils, for a first gradient axis, including two primary coils disposed opposite each other in a radial layer, said primary coils being separated from each other in said radial layer by gaps in said radial layer and each of said primary coils subtending a first angle in said radial layer;
   a second plurality of saddle coils, for a second gradient axis, including two auxiliary coils respectively disposed in said radial layer in said gaps and each of said auxiliary coils subtending a second angle which is less than said first angle; and
   selectively switchable connections among said saddle coils in said first plurality of saddle coils for producing a selected performance feature relative to said first gradient axis, and selectively connectable connections among said saddle coils in said second plurality of saddle coils for producing a selected performance feature relative to said second gradient axis said connections among said saddle coils in said first plurality of saddle coils, and said connections among said saddle coils in said second plurality of saddle coils, comprising static connections made prior to executing a magnetic resonance imaging sequence using said first plurality of saddle coils and said second plurality of saddle coils.

2. A magnetic gradient coil system as claimed in claim 1 wherein said first angle is greater than or equal to 90°.

3. A magnetic gradient coil system as claimed in claim 1 wherein said first angle is approximately 120°.

4. A magnetic gradient coil system as claimed in claim 1 wherein said radial layer is a first radial layer, and wherein said first plurality of saddle coils also includes two auxiliary coils each subtending said second angle and wherein said second plurality of saddle coils also includes two primary coils, each subtending said first angle, and wherein said primary coils of said second plurality of saddle coils are disposed opposite each other in a second radial layer separated from each other in said second radial layer by gaps in said second radial layer, and wherein said auxiliary coils of said first plurality of saddle coils are disposed in said second radial layer in said gaps in said second radial layer, and wherein said first radial layer and said second radial layer are radially spaced from each other.

5. A magnetic gradient coil system as claimed in claim 4 wherein said auxiliary coils in said first plurality of saddle coils comprise a first coil pair and wherein said auxiliary coils in said second plurality of saddle coils comprise a second coil pair, sold first coil pair being offset from said second coil pair by 90°, and said second angle being less than or equal to 90°.

6. A magnetic gradient coil system as claimed in claim 5 wherein said first angle is approximately 120°.

7. A magnetic gradient coil system as claimed in claim 4 wherein said primary coils in said first plurality of saddle coils are each comprised of a plurality of sub-coils that are differently connectable with each other.

8. A magnetic gradient coil system as claimed in claim 4 wherein said primary coils in said second plurality of saddle coils are each comprised of a plurality of sub-coils that are differently connectable with each other.

9. A magnetic gradient coil system as claimed in claim 4 wherein said auxiliary coils in said first plurality of saddle coils are each comprised of a plurality of sub-coils that are differently connectable with each other.

10. A magnetic gradient coil system as claimed in claim 4 wherein said auxiliary coils in said second plurality of saddle coils are each comprised of a plurality of sub-coils that are differently connectable with each other.

11. A magnetic gradient coil system comprising:
    a first plurality of saddle coils, for a first gradient axis, including two primary coils disposed opposite each other in a first radial layer, and to auxiliary coils, said two primary coils in said first plurality each subtending a first angle in said first radial layer;
    a second plurality of saddle coils, for a second gradient axis, including two primary coils disposed opposite each other in a second radial layer, and two auxiliary coils, said primary coils in said second plurality each subtending said first angle in said second radial layer;
    said auxiliary coils in said first plurality and said auxiliary coils in said second plurality all being disposed in a third radial plane, said auxiliary coils in said first plurality and said auxiliary coils in said second plurality each subtending a second angle in said third radial plane which is less than said first angle, said first, second and third radial planes being radially spaced from each other; and
    selectively switchable connections among said saddle coils in said first plurality of saddle coils for producing a selected performance feature relative to said first gradient axis, and selectively connectable connections among said saddle coils in said second plurality of saddle coils for producing a selected performance feature relative to said second gradient axis said connections among said saddle coils in said first plurality of saddle coils, and said connections among said saddle coils in said second plurality of saddle coils, comprising static connections made prior to executing a magnetic resonance imaging sequence using said first plurality of saddle coils and said second plurality of saddle coils.

12. A magnetic gradient coil system as claimed in claim 11 wherein said first angle is greater than or equal to 90°.

13. A magnetic gradient coil system as claimed in claim 11 wherein said first angle is approximately 120°.

14. A magnetic gradient coil system as claimed in claim 11 wherein said auxiliary coils in said first plurality of saddle coils comprise a first coil pair and wherein said auxiliary coils in said second plurality of saddle coils comprise a second coil pair, said first coil pair being offset from said second coil pair by 90°, and said second angle being less than or equal to 90°.

15. A magnetic gradient coil system as claimed in claim 14 wherein said first angle is approximately 120°.

16. A magnetic gradient coil system as claimed in claim 11 wherein said primary coils in said first plurality of saddle coils are each comprised of a plurality of sub-coils that are differently connectable with each other.

17. A magnetic gradient coil system as claimed in claim 11 wherein said primary coils in said second plurality of saddle coils are each comprised of a plurality of sub-coils that are differently connectable with each other.

18. A magnetic gradient coil system as claimed in claim 11 wherein said auxiliary coils in said first plurality of saddle coils are each comprised of a plurality of sub-coils that are differently connectable with each other.

19. A magnetic gradient coil system as claimed in claim 11 wherein said auxiliary coils in said second plurality of saddle coils are each comprised of a plurality of sub-coils that are differently connectable with each other.

20. A magnetic gradient coil system comprising:
   a first plurality of saddle coils, for a first gradient axis, including two primary coils disposed opposite each other in a radial layer, said primary coils being separated from each other in said radial layer by gaps in said radial layer and each of said primary coils subtending a first angle in said radial layer;
   a second plurality of saddle coils, for a second gradient axis, including two auxiliary coils respectively disposed in said radial layer in said gaps and each of said auxiliary coils subtending a second angle which is less than said first angle; and
   selectively switchable connections among said saddle coils in said first plurality of saddle coils for producing a selected performance feature relative to said first gradient axis, and selectively connectable connections among said saddle coils in said second plurality of saddle coils for producing a selected performance feature relative to said second gradient axis said connections among said saddle coils in said first plurality of saddle coils, and said connections among said saddle coils in said second plurality of saddle coils, comprising dynamic connections made during execution of a magnetic resonance imaging sequence using said first plurality of saddle coils and said second plurality of saddle coils.

21. A magnetic gradient coil system as claimed in claim 20 wherein said first angle is greater than or equal to 90°.

22. A magnetic gradient coil system as claimed in claim 20 wherein said first angle is approximately 120°.

23. A magnetic gradient coil system as claimed in claim 20 wherein said radial layer is a first radial layer, and wherein said first plurality of saddle coils also includes two auxiliary coils each subtending said second angle and wherein said second plurality of saddle coils also includes two primary coils, each subtending said first angle, and wherein said primary coils of said second plurality of saddle coils are disposed opposite each other in a second radial layer separated from each other in said second radial layer by gaps in said second radial layer, and wherein said auxiliary coils of said first plurality of saddle coils are disposed in said second radial layer in said gaps in said second radial layer, and wherein said first radial layer and said second radial layer are radially spaced from each other.

24. A magnetic gradient coil system as claimed in claim 23 wherein said auxiliary coils in said first plurality of saddle coils comprise a first coil pair and wherein said auxiliary coils in said second plurality of saddle coils comprise a second coil pair, said first coil pair being offset from said second coil pair by 90°, and said second angle being less than or equal to 90°.

25. A magnetic gradient coil system as claimed in claim 24 wherein said first angle is approximately 120°.

26. A magnetic gradient coil system as claimed in claim 23 wherein said primary coils in said first plurality of saddle coils are each comprised of a plurality of sub-coils that are differently connectable with each other.

27. A magnetic gradient coil system as claimed in claim 23 wherein said primary coils in said second plurality of saddle coils are each comprised of a plurality of sub-coils that are differently connectable with each other.

28. A magnetic gradient coil system as claimed in claim 23 wherein said auxiliary coils in said first plurality of saddle coils are each comprised of a plurality of sub-coils that are differently connectable with each other.

29. A magnetic gradient coil system as claimed in claim 23 wherein said auxiliary coils in said second plurality of saddle coils are each comprised of a plurality of sub-coils that are differently connectable with each other.

30. A magnetic gradient coil system comprising:
   a first plurality of saddle coils, for a first gradient axis, including two primary coils disposed opposite each other in a first radial layer, and to auxiliary coils, said two primary coils in said first plurality each subtending a first angle in said first radial layer;
   a second plurality of saddle coils, for a second gradient axis, including two primary coils disposed opposite each other in a second radial layer, and two auxiliary coils, said primary coils in said second plurality each subtending said first angle in said second radial layer;
   said auxiliary coils in said first plurality and said auxiliary coils in said second plurality all being disposed in a third radial plane, said auxiliary coils in said first plurality and said auxiliary coils in said second plurality each subtending a second angle in said third radial plane which is less than said first angle, said first, second and third radial planes being radially spaced from each other; and
   selectively switchable connections among said saddle coils in said first plurality of saddle coils for producing a selected performance feature relative to said first gradient axis, and selectively connectable connections among said saddle coils in said second plurality of saddle coils for producing a selected performance feature relative to said second gradient axis said connections among said saddle coils in said first plurality of saddle coils, and said connections among said saddle coils in said second plurality of saddle coils, comprising dynamic connections made during execution of a magnetic resonance imaging sequence using said first plurality of saddle coils and said second plurality of saddle coils.

31. A magnetic gradient coil system as claimed in claim 30 wherein said first angle is greater than or equal to 90°.

32. A magnetic gradient coil system as claimed in claim 30 wherein said first angle is approximately 120°.

33. A magnetic gradient coil system as claimed in claim 30 wherein said auxiliary coils in said first plurality of saddle coils comprise a first coil pair and wherein said auxiliary coils in said second plurality of saddle coils comprise a second coil pair, said first coil pair being offset from said second coil pair by 90°, and said second angle being less than or equal to 90°.

34. A magnetic gradient coil system as claimed in claim 33 wherein said first angle is approximately 120°.

35. A magnetic gradient coil system as claimed in claim 30 wherein said primary coils in said first plurality of saddle coils are each comprised of a plurality of sub-coils that are differently connectable with each other.

36. A magnetic gradient coil system as claimed in claim 30 wherein said primary coils in said second plurality of saddle coils are each comprised of a plurality of sub-coils that are differently connectable with each other.

37. A magnetic gradient coil system as claimed in claim 30 wherein said auxiliary coils in said first plurality of saddle coils are each comprised of a plurality of sub-coils that are differently connectable with each other.

38. A magnetic gradient coil system as claimed in claim 30 wherein said auxiliary coils in said second plurality of saddle coils are each comprised of a plurality of sub-coils that are differently connectable with each other.

* * * * *